United States Patent
Rhodes et al.

[19]

[11] Patent Number: 5,960,314
[45] Date of Patent: Sep. 28, 1999

[54] SEMICONDUCTOR PROCESSING METHOD OF PROVIDING AN ELECTRICALLY CONDUCTIVE INTERCONNECTING PLUG BETWEEN AN ELEVATIONALLY CONDUCTIVE NODE AND AN ELEVATIONALLY OUTER ELECTRICALLY CONDUCTIVE NODE

[75] Inventors: Howard E. Rhodes; Timothy P. O'Brien; Rod C. Langley, all of Boise, Id.

[73] Assignee: Micron Technology, Inc., Boise, Id.

[21] Appl. No.: 09/156,231

[22] Filed: Sep. 18, 1998

Related U.S. Application Data

[63] Continuation of application No. 08/569,283, Dec. 8, 1995, Pat. No. 5,817,573, which is a continuation of application No. 08/430,758, Apr. 28, 1995, Pat. No. 5,496,773.

[51] Int. Cl.$^6$ ...................... H01L 21/285; H01L 21/3065
[52] U.S. Cl. .......................... 438/626; 438/629; 438/648; 438/672
[58] Field of Search .................................. 438/629, 672, 438/677, 628, 648, 626, 685, 720; 257/753, 763

[56] References Cited

U.S. PATENT DOCUMENTS

| | | | |
|---|---|---|---|
| 5,141,897 | 8/1992 | Manocha et al. | 156/643 |
| 5,167,760 | 12/1992 | Mu et al. | 437/187 |
| 5,231,051 | 7/1993 | Baldi et al. | 257/770 |
| 5,233,223 | 8/1993 | Murayama | 437/190 |
| 5,254,498 | 10/1993 | Sumi | 437/190 |
| 5,312,773 | 5/1994 | Nagashima | 156/643 |
| 5,326,427 | 7/1994 | Jerbic | 205/123 |
| 5,358,621 | 10/1994 | Oyama | 437/192 |
| 5,364,817 | 11/1994 | Lur et al. | 437/189 |
| 5,374,849 | 12/1994 | Tada | 257/751 |
| 5,387,550 | 2/1995 | Cheffings et al. | 437/192 |
| 5,397,742 | 3/1995 | Kim | 437/190 |
| 5,407,861 | 4/1995 | Marangon et al. | 437/192 |
| 5,496,773 | 3/1996 | Rhodes et al. | 437/189 |
| 5,817,573 | 10/1998 | Rhodes et al. | 438/626 |

FOREIGN PATENT DOCUMENTS 5-226280  2/1992  Japan .

OTHER PUBLICATIONS

Riley, P., et al., "Implementation of Tungsten Metallization in Multilevel Interconnection Technologies", *IEEE Transactions On Semiconductor Manufacturing*, vol. 3, No. 4, Nov. 1990, pp. 150–157.

Wolf et al., "Silicon Processing", vol. 1, 1986, *Lattice Presss*, pp. 348–353; 539–547.

Riley, P., et al., "Development of a Magnetron–Enhanced Plasma Process for Tungsten Etchback with Response–Surface Methodology", *IEEE Transactions on Semi. Manuf.*, vol. 3, No. 3, Aug. 1990, pp. 142–144.

*Primary Examiner*—T. N. Quach
*Attorney, Agent, or Firm*—Wells, St.John, Roberts, Gregory & Matkin, P.S.

[57] ABSTRACT

A semiconductor processing method of providing an electrically conductive interconnecting plug between an elevationally inner conductive node and an elevationally outer conductive node includes, a) providing an inner node location to which electrical connection is to be made; b) providing an electrically insulative layer outwardly over the inner node location; c) patterning and etching a contact opening through the insulative layer to the inner node location; d) substantially filling the contact opening with an electrically conductive material to provide a conductive plug within the contact opening to the inner node location, the conductive plug defining an outermost fang gap between the conductive plug and the electrically insulative layer, the fang gap having a first width; e) widening the fang gap to a second width which is greater than the first width by a timed RF plasma etch of the electrically conductive material; f) providing an outer metal layer over the conductive plug after the widening step, the metal layer at least partially filling the widened fang gap; and g) patterning the metal layer into a conductive line which electrically interconnects with the conductive plug.

6 Claims, 3 Drawing Sheets

SEMICONDUCTOR PROCESSING METHOD OF PROVIDING AN ELECTRICALLY CONDUCTIVE INTERCONNECTING PLUG BETWEEN AN ELEVATIONALLY CONDUCTIVE NODE AND AN ELEVATIONALLY OUTER ELECTRICALLY CONDUCTIVE NODE

RELATED PATENT DATA

This application resulted from a continuation application of U.S. patent application Ser. No. 08/569,283, filed Dec. 8, 1995, U.S Pat. No. 5,817,573 which is a continuation application of U.S. patent application Ser. No. 08/430,758, filed on Apr. 28, 1995, which is now U.S. Pat. No. 5,496,773.

TECHNICAL FIELD

This invention relates, in part, to multi-metal layer semiconductor processing methods having provision and patterning of at least two separate metal layers, wherein the metal layers comprise an inner Metal 1 layer and an outer Metal 2 layer, and the method comprises provision of an electrically conductive interconnecting plug between an elevationally inner conductive node and the Metal 1 layer.

BACKGROUND OF THE INVENTION

Advanced semiconductor fabrication is employing increasing vertical circuit integration as designers continue to strive for circuit density maximization. Such typically includes multi-level metallization. Electrical interconnect techniques typically require electrical connection between metal layers or other conductive layers which are present at different elevations in the substrate. Such interconnecting is typically conducted, in part, by etching a contact opening through insulating material to the lower elevation metal layer or conductive region. Increased circuit density has resulted in narrower and deeper electrical contact openings between layers within the substrate. Adequate contact coverage within these deep and narrow contacts continues to challenge the designer in assuring adequate electrical connection between different elevation areas within the substrate.

This invention arose principally out of problems associated with tungsten plug formation in contacts formed through silicon dioxide insulating layers. The problem is best understood with reference to the accompanying FIGS. 1 and 2. There illustrated is a semiconductor wafer fragment 10 comprised of a bulk substrate 12 and an overlying silicon dioxide layer 14 such as borophosphosilicate glass (BPSG). Bulk substrate 12 includes a dopant diffusion/active region 16 to which electrical connection is to be made. A contact opening 18 is provided through BPSG layer 14 to active area 16.

A thin layer 20 of titanium is deposited atop the wafer to within contact opening 18. Titanium layer 20 is provided to function as a silicide formation layer at the base of contact 18 for reducing resistance. An undesired oxide layer (not shown) also typically forms atop diffusion region 16. The deposited elemental titanium also functions to break-up this undesired oxide and thereafter form a titanium silicide with the silicon of substrate 12 to reduce contact resistance between active area 16 and a subsequently deposited plug filling tungsten. Additionally, titanium layer 20 functions as an adhesion/nucleation layer for the subsequently deposited tungsten. Tungsten does not readily deposit over silicon dioxide and exposed silicon substrate, and the intervening titanium layer 20 facilitates deposition and adhesion of tungsten thereto.

Titanium layer 20 is typically deposited by sputter deposition, and undesirably results in formation of contact projecting cusps 22. This results in a back or re-entrant angle 24 being formed relative to contact opening 18. A layer 26 of tungsten is subsequently deposited, with the intent being to completely fill the remaining volume of contact opening 18. Unfortunately, an undesired keyhole 28 typically forms, leaving a void within contact 18.

Referring to FIG. 2, layers 26 and 20 are subsequently etched back by dry etch or chemical-mechanical polishing to form a contact-filling plug 30. Undesirably, this typically opens-up the upper end of keyhole 28. The etch back also undesirably etches titanium layer 20 and forms sharp edge "fangs" or "divots" 32. Even if titanium layer 20 were not present, the fangs would also typically be produced. With respect to the described example, this could occur by chemical attack of the oxide and titanium during the tungsten etch and by a typical subsequent HF dipping step.

Regardless, this can lead to subsequent problems associated with the Metal 1 layer deposition, as shown in FIG. 3. The Metal 1 layer typically comprises a composite thin titanium glue layer 34, a bulk conductive Al—Cu alloy layer 36, and an antireflective titanium nitride coating layer 38. Other composite layers are of course possible. Regardless, fangs 32 typically preclude or hinder deposition of the composite Metal 1 layer. Specifically, glue layer 34 does not fill fangs 32 and alloy layer 36 produces cusps which hinder deposition even atop plug 30. Glue layer 34 and coating layer 38 do contact the top of plug 30 but, in the extreme case, adequate electrical connection is not made between the composite Metal 1 layer and tungsten plug 30. This problem is especially pronounced with tungsten plug formation, but can also occur with other electrically conductive plug filling materials such as other metals, metal alloys and polysilicon.

It would be desirable to overcome these and other problems associated with formation of electrically conductive contact plugs.

BRIEF DESCRIPTION OF THE DRAWINGS

Preferred embodiments of the invention are described below with reference to the following accompanying drawings.

SUMMARY OF THE INVENTION

Figure 1:
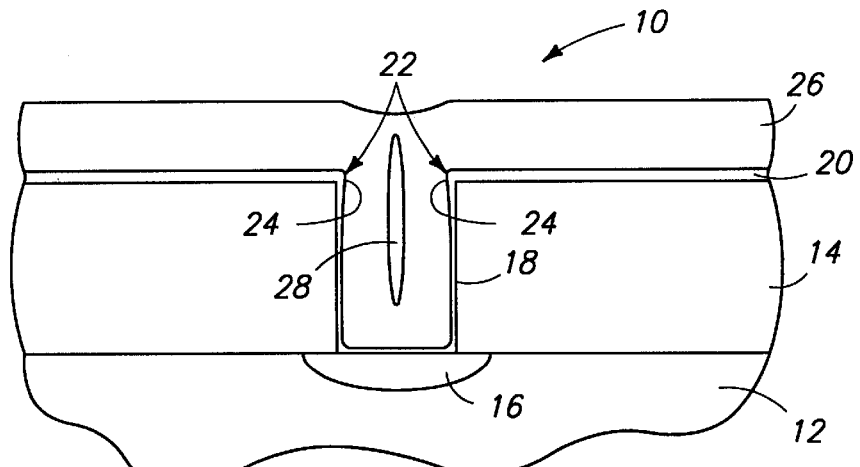
FIG. 1 is a diagrammatic sectional view of a prior art semiconductor wafer fragment discussed in the "Background" section above.

This disclosure of the invention is submitted in furtherance of the constitutional purposes of the U.S. Patent Laws "to promote the progress of science and useful arts" (Article 1, Section 8).

In accordance with one aspect of the invention, a multi-metal layer semiconductor processing method comprising provision and patterning of at least two separate metal layers, the metal layers comprising an inner Metal 1 layer and an outer Metal 2 layer, the method comprising provision of an electrically conductive interconnecting plug between an elevationally inner conductive node and the Metal 1 layer, the method comprises the following steps:

provide an inner node location to which electrical connection is to be made;

providing an electrically insulative layer outwardly over the inner node location;

patterning and etching a contact opening through the insulative layer to the inner node location;

substantially filling the contact opening with an electrically conductive material to provide a conductive plug within the contact opening to the inner node location, the conductive plug defining an outermost fang gap between the conductive plug and the electrically insulative layer, the fang gap having a first width;

widening the fang gap to a second width which is greater than the first width by a timed RF plasma etch of the electrically conductive material;

providing a Metal 1 layer over the conductive plug after the widening step, the Metal 1 layer at least partially filling the widened fang gap;

patterning the Metal 1 layer into a conductive line which electrically interconnects with the electrically conductive plug; and providing and patterning a Metal 2 layer outwardly of the Metal 1 layer.

In accordance with another aspect of the invention, a semiconductor processing method of providing an electrically conductive interconnecting plug between an elevationally inner conductive node and an elevationally outer conductive node, the method comprises the following steps:

providing an inner node location to which electrical connection is to be made;

providing an electrically insulative layer outwardly over the inner node location;

patterning and etching a contact opening through the insulative layer to the inner node location;

substantially filling the contact opening with an electrically conductive material to provide a conductive plug within the contact opening to the inner node location, the conductive plug defining an outermost fang gap between the conductive plug and the electrically insulative layer, the fang gap having a first width;

widening the fang gap to a second width which is greater than the first width by a timed RF plasma etch of the electrically conductive material;

providing an outer metal layer over the conductive plug after the widening step, the metal layer at least partially filling the widened fang gap; and patterning the metal layer into a conductive line which electrically interconnects with the conductive plug.

DETAILED DESCRIPTION OF THE PREFERRED EMBODIMENT

Figure 2:
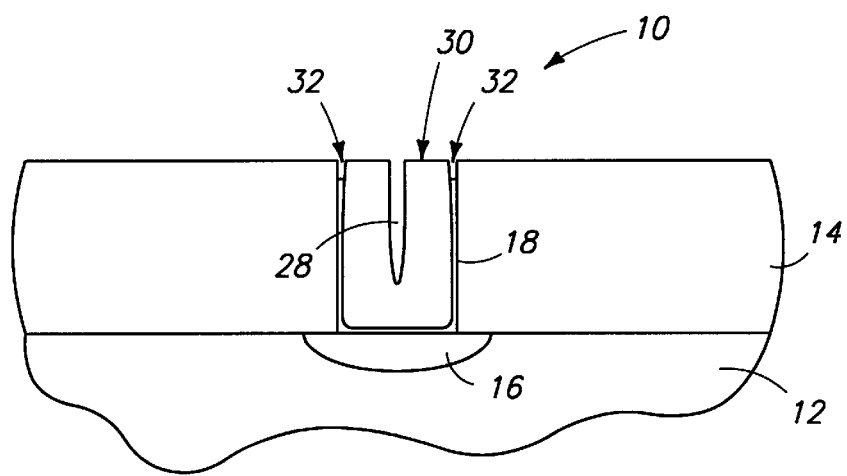
FIG. 2 is a view of the FIG. 1 wafer fragment at a processing step subsequent to that shown by FIG. 1.
Figure 3:
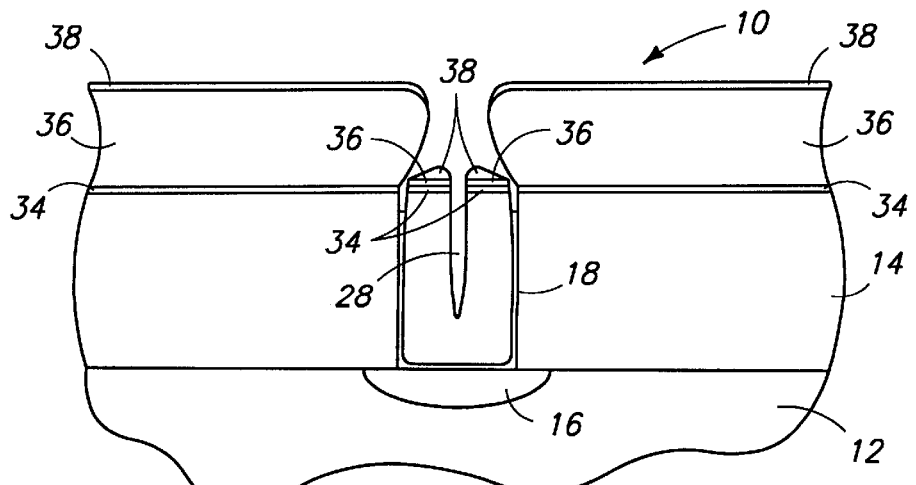
FIG. 3 is a view of the FIG. 1 wafer fragment at a processing step subsequent to that shown by FIG. 2.
Figure 4:
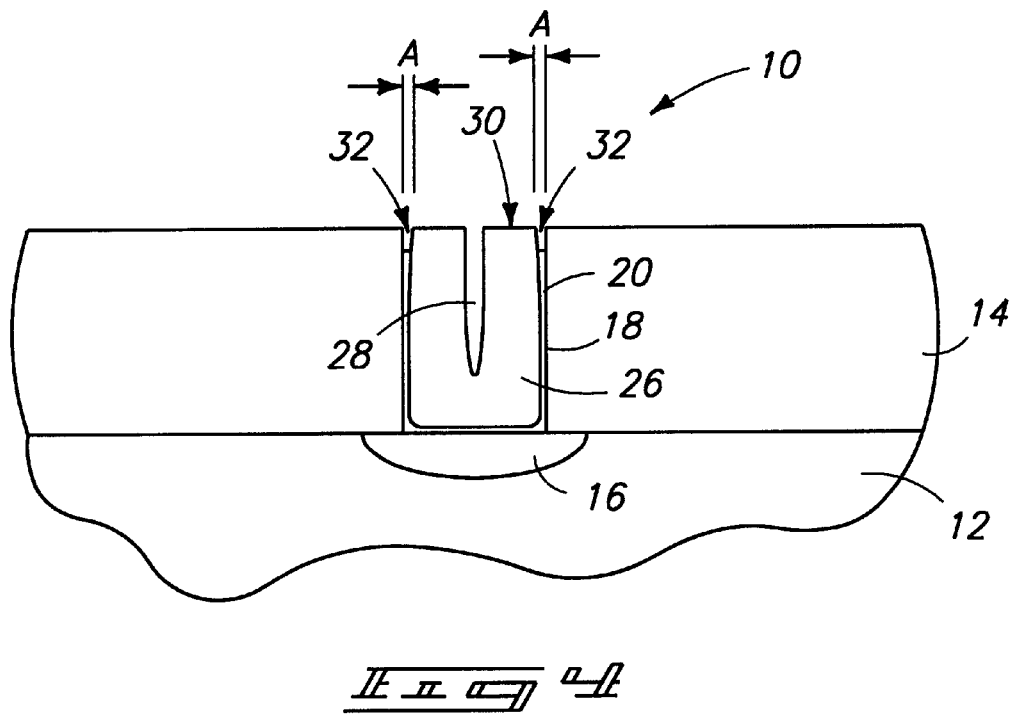
FIG. 4 is a diagrammatic sectional view of a semiconductor wafer fragment at one processing step in accordance with the invention.
Figure 5:
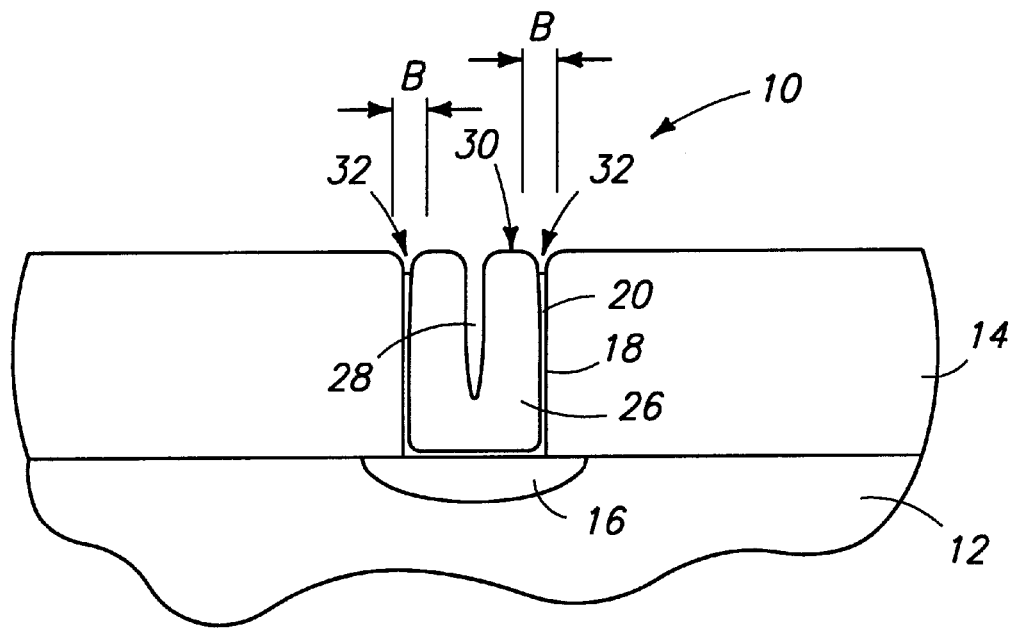
FIG. 5 is a view of the FIG. 4 wafer fragment at a processing step subsequent to that shown by FIG. 4.

More particularly and first with reference to FIG. 4, the FIG. 2 prior art construction is shown. In accordance with the invention, active region 16 constitutes an inner node location to which electrical connection is to be made to a Metal 1 layer. BPSG layer 14 constitutes an electrically insulative layer positioned outwardly over inner node 16. Contact opening 18 is provided therethrough. Contact opening 18 is substantially filed with tungsten or some other electrically conductive material to provide a conductive plug 30 within contact opening 18 to inner node location 16. Conductive plug 30 defines an outermost fang gap "A" between plug 30 and electrically insulative layer 14. Fang gap "A" defines a first gap width, as shown. An expected example gap width "A" where layer 14 is 2.0 microns thick and contact opening 18 is 0.7 microns wide, is from 200 Angstroms to 800 Angstroms. In accordance with the invention and with reference to FIG. 5, fang gap "A" is widened to a second greater width "B" by a timed RF plasma etch of the electrically conductive material. The RF plasma etch is conducted at a power from 100 Watts to 2,000 Watts, and for a time period less than or equal to 60 seconds. Bias voltage is from −100 Volts to −2000 Volts. Argon is the preferred bombarding substance, with a preferred feed rate during etching being from 10 sccm to 75 sccm. Other possible substances could be used, such as another nobel gas, $N^2$, or a reactive gas. Most preferably and in accordance with the above preferred process parameters, the RF plasma etching step etches both the conductive plug and the adjacent electrically insulative layer to widen the fang gap. The above described RF plasma etching also provides the advantage of removing the thin oxide layer which typically forms atop the tungsten or other conductive plug prior to Metal 1 deposition. For control purposes, the preferred RF plasma etch is conducted to remove from 100 Angstroms to 1,000 Angstroms of the adjacent oxide material, which will typically remove up to 100 Angstroms of tungsten. An example widened fang gap "B" is 0.15 micron.

The RF plasma etching is preferably conducted in a reactor capable of immediate subsequent deposition of the composite Metal 1 layers. The invention was reduced to practice using a Materials Research Corporation, Model MRC reactor.

Figure 6:
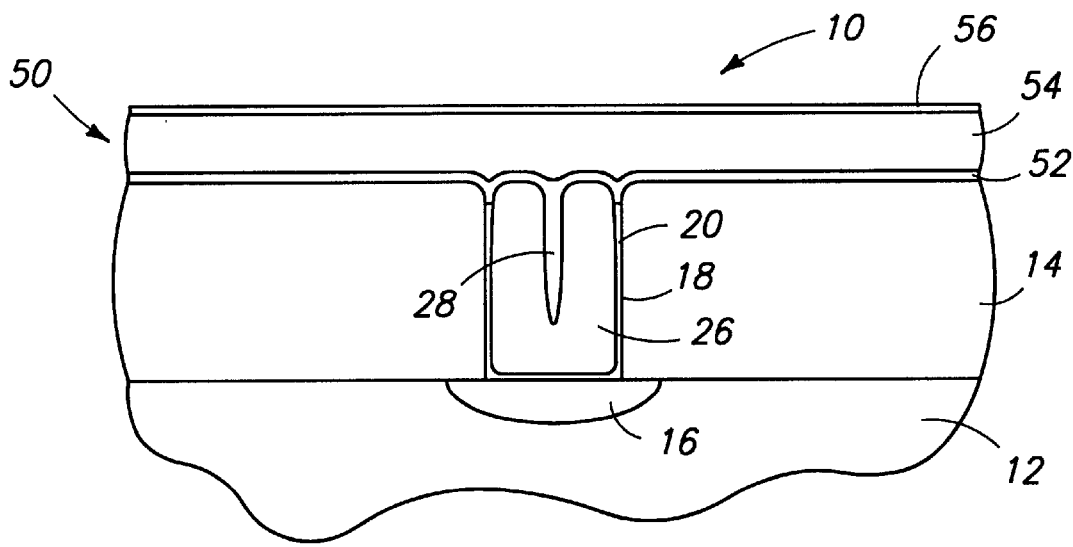
FIG. 6 is a view of the FIG. 4 wafer fragment at a processing step subsequent to that shown by FIG. 5.

Referring to FIG. 6, a composite Metal 1 layer 50 is provided over conductive plug 30 after the widening step, with the composite Metal 1 layer 50 at least partially and preferably substantially filling the illustrated widened fang gap. Specifically, composite Metal 1 layer for example comprises a first Ti layer 52, with 500 Angstroms being a nominal thickness. A second Al—Cu alloy layer 54 is provided to a nominal thickness of 5,000 Angstroms. A subsequent TiN antireflective coating layer 56 is provided to a nominal thickness of 300 Angstroms. Such composite layer 50 is patterned into a conductive line (with such patterning being out of the plane of the page upon which FIG. 6 appears) to provide a conductive line which electrically connects with conductive plug 30.

Figure 7:
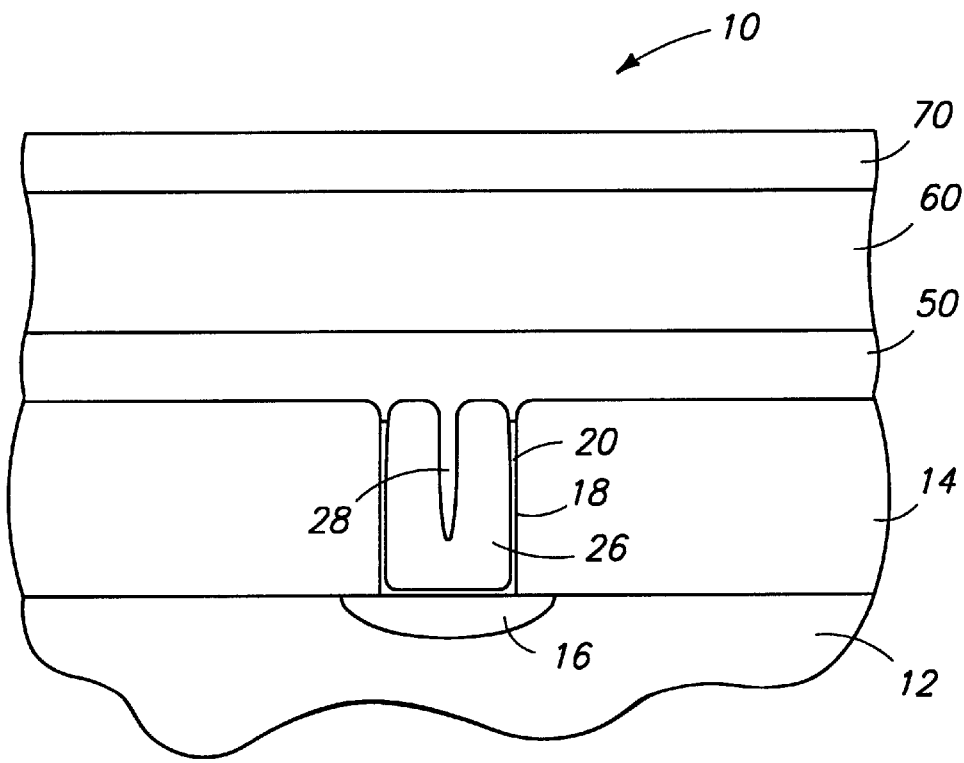
FIG. 7 is a view of the FIG. 4 wafer fragment at a processing step subsequent to that shown by FIG. 6.

Referring to FIG. 7, a subsequently deposited insulative layer 60 is provided and patterned in accordance with other processing. Thereafter, a Metal 2 layer 70 is provided for making electrical connection with desired nodes on the wafer to produce a two metal process. Thus, a Metal 2 layer is provided and patterned outwardly of a Metal 1 layer.

The invention was reduced to practice in connection with the following five test groups (10 wafers each) having the illustrated FIG. 4 construction prior to Metal 1 deposition and patterning. The initial fang gap in each instance was estimated to be from 200 Angstroms.

| | |
|---|---|
| Control: | No RF etch |
| | 500 A Ti |
| | 5k A Al/Cu |
| | 200 A Ti |
| EXP 1: | RF Process: |
| | Power = 1000 Watts |
| | Bias = 150 V |
| | Time = 45 sec. |
| | 500 A Ti |
| | 5k A Al/Cu |
| | 200 A Ti |
| EXP 2: | RF Process: |
| | Power = 1000 Watts |
| | Bias = 250 V |
| | Time = 45 sec. |
| | 500 A Ti |
| | 5k A Al/Cu |
| | 200 A Ti |
| EXP 3: | RF Process: |
| | Power = 1500 Watts |
| | Bias = 150 V |
| | Time = 45 sec. |
| | 500 A Ti |
| | 5k A Al/Cu |
| | 200 A Ti |
| EXP 4: | RF Process: |
| | Power = 1500 Watts |
| | Bias = 250 V |
| | Time = 45 sec. |
| | 500 A Ti |
| | 5k A Al/Cu |
| | 200 A Ti |

In accordance with the above experiments, the control group wafers did not provide effective reliable electrical connections, wherein each of the above four experiment group wafers all provided reliable electrical connection. Specifically, the control group wafers and experiment group wafers both had high acceptable yield at probe test, but at burn-in testing, the control wafers experienced a high failure rate where the inventive wafers did not.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method for connecting a metal layer to a plug when there is a fang gap between the plug and a layer surrounding the plug, the method comprising:

forming a conductive material within an opening in a surrounding layer, the conductive material comprising tungsten;

etching the conductive material with a first etch chemistry to form a fang gap between the conductive material and the surrounding layer, the fang gap having a first width;

etching the conductive material with a second etch chemistry to widen the fang gap to a second width which is greater than the first width, the second etch chemistry being different from the first etch chemistry; and providing an outer metal layer over the conductive plug after widening the fang gap, the metal layer at least partially filling the widened fang gap.

2. The method of claim 1 wherein the second etch chemistry comprises a timed RF plasma etch of the conductive material.

3. The method of claim 1 wherein the surrounding layer is an insulative layer.

4. The method of claim 1 further comprising a step of patterning the provided metal layer into a conductive line.

5. The method of claim 1 further comprising etching the surrounding layer with the second etch chemistry.

6. The method of claim 1 wherein the first etch chemistry comprises either dry etching or chemical-mechanical polishing and the second etch chemistry comprises a timed RF plasma etch.

* * * * *